United States Patent
Hynes et al.

(10) Patent No.: US 6,916,378 B2
(45) Date of Patent: Jul. 12, 2005

(54) ROTARY DISPENSER AND METHOD FOR USE

(75) Inventors: Anthony Joseph Hynes, Ballston Spa, NY (US); Jonathan N. Urquhart, Clifton Park, NY (US); Richard John Bievenue, Burnt Hills, NY (US)

(73) Assignee: Precision Valve & Automation, Inc., Halfmoon, NY (US)

( * ) Notice: Subject to any disclaimer, the term of this patent is extended or adjusted under 35 U.S.C. 154(b) by 388 days.

(21) Appl. No.: 10/041,259

(22) Filed: Jan. 8, 2002

(65) Prior Publication Data

US 2003/0129317 A1 Jul. 10, 2003

(51) Int. Cl.[7] .............................................. B05C 11/00
(52) U.S. Cl. ...................................... 118/669; 118/323
(58) Field of Search .............................. 118/323, 306, 118/679, 669, 683, 684, 317, 321; 901/43; 239/263.1, 69, 264

(56) References Cited

U.S. PATENT DOCUMENTS

| | | | |
|---|---|---|---|
| 2,846,973 A | * | 8/1958 | O'Callaghan ............... 118/317 |
| 3,422,795 A | | 1/1969 | Smith |
| 4,080,927 A | | 3/1978 | Brown |
| 4,189,085 A | | 2/1980 | Penrod |
| 4,251,573 A | | 2/1981 | Holm et al. |
| 4,272,020 A | | 6/1981 | Allison |
| 4,905,913 A | * | 3/1990 | Frikker |
| 4,944,459 A | * | 7/1990 | Watanabe et al. |
| 4,972,797 A | | 11/1990 | Muller |
| 5,080,056 A | | 1/1992 | Kramer et al. |
| 5,098,024 A | * | 3/1992 | MacIntyre et al. |
| 5,203,842 A | * | 4/1993 | Mark et al. |
| 5,273,059 A | * | 12/1993 | Gross et al. |
| 5,334,235 A | | 8/1994 | Dorfman et al. |
| 5,353,995 A | | 10/1994 | Chabert |
| 5,377,913 A | * | 1/1995 | Van Der Woude |
| 5,452,853 A | | 9/1995 | Shook et al. |
| 5,894,993 A | | 4/1999 | Takayama et al. |
| 5,897,060 A | | 4/1999 | Kon et al. |
| 6,066,575 A | | 5/2000 | Reardon et al. |

* cited by examiner

Primary Examiner—Brenda A. Lamb
(74) Attorney, Agent, or Firm—Schmeiser, Olsen & Watts

(57) ABSTRACT

A rotary dispenser that provides for airlessly applying a fluidic coating material to a target surface. The rotary dispenser of the present invention includes an angled fluidic passage therein, a fluid control body and a motor driven shaft to which the rotary dispenser is operationally attached. The rotary dispenser, with its angled fluid passage, provides a flow conduit which produces a series of overlapping circular spray patterns. The resulting spray patterns can be controlled to provide a narrow line spray pattern with clearly defined edges. Another embodiment of the present invention provides a spray pattern for coating the interior surface of hollow objects. A method of using the rotary dispenser in various coating applications is also disclosed.

2 Claims, 4 Drawing Sheets

ROTARY DISPENSER AND METHOD FOR USE

FIELD OF THE INVENTION

The present invention relates generally to systems for depositing a material onto a surface, and more particularly, to spraying devices for spraying coatings onto production articles, such as circuit boards, in the conformal coating industry. Coating spraying devices are as well used for coating the interior surfaces of hollow objects.

BACKGROUND OF THE INVENTION

1. Technical Field

Uniform thickness coatings are often applied over sections of circuit boards. The coatings prevent water vapor, gases, or fluids from corroding the electrical connections on a circuit board. The coatings may comprise a wide variety of materials such as ultraviolet (UV) acrylic gels, moisture and thermal cure silicones, and the like.

2. Related Art

Coatings are typically applied to a circuit board using devices such as spray guns or spray nozzles. Such devices generally include a liquid spray material that is atomized by compressed air and is then directed toward the surface to be coated. The spraying devices are commonly attached to an apparatus, such as a multi-degree of freedom robotic positioning apparatus, that provides accurate positional displacement relative to the article being coated.

As electronic components mounted on circuit boards become smaller, and more compactly spaced, known large diameter spray nozzles can no longer provide the edge control necessary to provide accurate coating deposition in particular areas of circuit boards. The edge of the conformal coating must be accurately maintained over large areas of the circuit board, while simultaneously the degree of spattering or erroneous deposition of coating material must be minimized.

Furthermore, there is now an increasingly common requirement for providing a small diameter spray pattern with clearly defined edges to provide the accuracy and precision required to produce the spray in the narrowly defined space created by closely spaced electronic components.

SUMMARY OF THE INVENTION

In order to overcome the above deficiencies, the present invention provides a rotary dispenser that produces a circular spray pattern whose edge can be precisely controlled, by using a fluid dispensing conduit which extends at an oblique angle with respect to the axis of rotation of the rotary dispenser. The fluid dispensing conduit extends from an outer, planar surface of the rotary dispenser, to the central interior of the rotary dispenser.

For generating a round spray pattern, the rotary dispenser is rotated about its longitudinal axis while a coating material is forced through the rotary dispenser, producing a spray pattern such as round. This round spray pattern is then projected onto a surface, such as, inter alia, a circuit board surface. The rotary dispenser can then be moved laterally, while continuously dispensing coating material, to produce a band of coating material having clearly defined edges.

In a first general aspect, the present invention provides apparatus which includes a drive motor; a rotary shaft, having a first end and a second end, said first end operationally coupled to said drive motor; at least one fluid dispensing conduit, within said rotary shaft, having a first centerline and a second centerline, and an outlet positioned at said second end of said rotary shaft; and wherein an angle exists between said first centerline and said second centerline, said angle being an oblique angle.

In a second general aspect, the present invention provides a coating application system comprising: a supply of fluidic coating material; a fluidic coating material control system for supplying said fluidic coating material to a material discharge system; a coating material supply system in communication with said material discharge system; a rotary dispenser operationally coupled to said material discharge system; an in-line drive system, for supplying motive power to move said rotary dispenser in a rotary direction and in a lateral direction, said drive system operationally coupled to said rotary dispenser; and a fluid passage extending through said rotary dispenser, said fluid passage having a first end in communication with said material discharge system and a second end in communication with an outlet opening, wherein said fluid passage forms an oblique angle between said first end and said second end.

In a third general aspect, the present invention provides a method for applying a coating material, said method comprising the steps of: providing a rotary dispenser having a coating material supply chamber therein, and a fluid dispensing conduit therein, wherein said fluid dispensing conduit is operationally coupled to said coating material supply chamber, and wherein the fluid dispensing conduit is positioned at an oblique angle to said coating material supply chamber; providing a supply of coating material to said rotary dispenser; coupling said dispenser to a drive motor; rotating said rotary dispenser; and projecting the coating material toward a surface to form a pattern.

In a fourth general aspect, the present invention provides an apparatus comprising: a robotic precision controller; a drive motor; a rotary shaft, having a first end and a second end, said first end operationally coupled to said drive motor; at least one fluid dispensing conduit, within said rotary shaft, having a first centerline and a second centerline, and an outlet positioned at said second end of said rotary shaft; and wherein an angle exists between said first centerline and said second centerline, said angle being an oblique angle.

BRIEF DESCRIPTION OF THE DRAWINGS

The features of the present invention will best be understood from a detailed description of the invention and an embodiment thereof selected for the purposes of illustration and shown in the accompanying drawings in which.

DETAILED DESCRIPTION OF THE INVENTION

Figure 3:
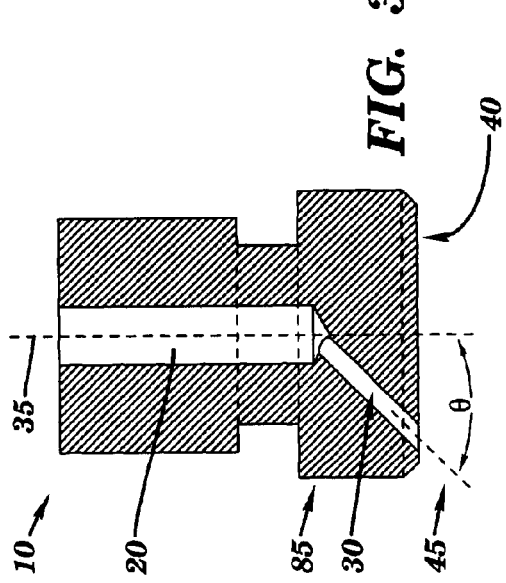
FIG. 3 is a cross-sectional side view of the rotary dispenser of FIG. 2.

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of an embodiment. The features and advantages of the present invention are illustrated in detail in the accompanying drawings, wherein like reference numerals refer to like elements throughout the drawings.

Figure 1:
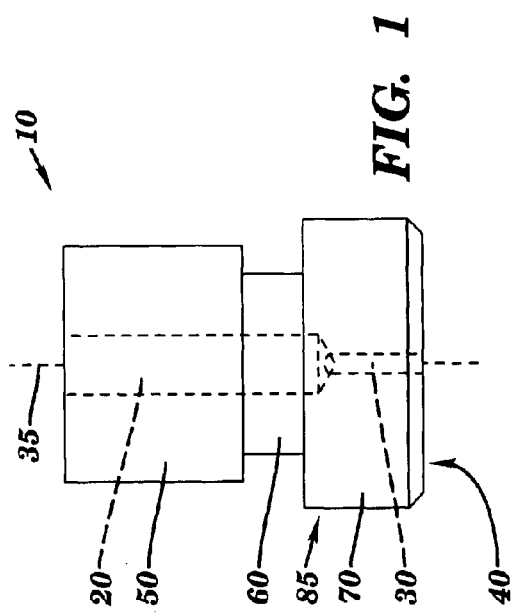
FIG. 1 is a front view of a rotary dispenser in accordance with an embodiment of the present invention.

Referring to FIG. 1, there is illustrated a front view of a rotary dispenser 10 in accordance with an embodiment of the present invention. The rotary dispenser 10 includes a coating material supply chamber 20 extending through a first section 50, a second section 60 and a third section 70. The rotary dispenser 10 also includes a fluid dispensing conduit 30, which extends from the coating material supply chamber 20 to an outer face 40 of the rotary dispenser 10.

The size and shapes of first section 50, a second section 60 and a third section 70 are shown in exemplary forms. The sizes and shapes can be adjusted to accommodate existing coating machinery wherein a known dispenser could be replaced with the novel rotary dispenser of the present invention. The rotary dispenser 10 is shaped to apply coating material to the interior of devices having geometries closely approximating the exterior of the rotary dispenser 10 such as, inter alia, test tubes, bottles, containers, etc. In an exemplary embodiment the rotary dispenser 10 is useful for printed circuit board coating applications, the overall height of the rotary dispenser 10 may be, inter alia, 0.300 inches, with the first section height being 0.15 inches, the second section height being 0.050 inches, and the third section height being 0.100 inches. The diameter of the coating material supply chamber 20 may be, inter alia, 0.047 inches to a depth of 0.227 inches. The diameter of the fluid dispensing conduit 30 may be, inter alia, 0.0156 inches.

Alternative embodiments of the rotary dispenser 10 may include more than one coating material supply chamber 20, or more than one fluid dispensing conduit 30.

Figure 2:
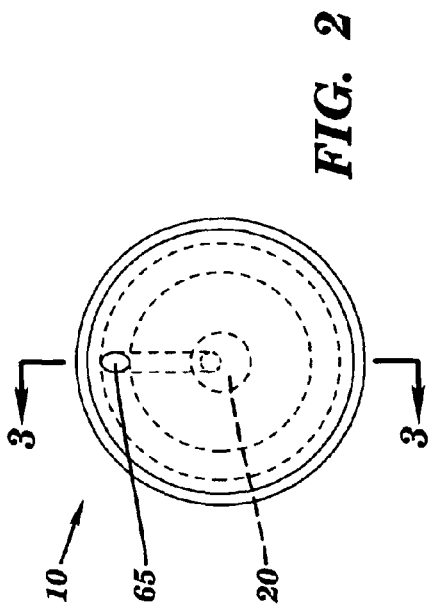
FIG. 2 is a bottom view of a rotary dispenser in accordance with an embodiment of the present invention.

FIG. 2 illustrates a bottom view of the rotary dispenser 10. Opening 65 represents the outer terminus of fluid dispensing conduit 30. As shown in FIG. 2, the fluid dispensing conduit 30 extends at an oblique angle from the coating material supply chamber 20 through the third section 70 of the rotary dispenser 10. In an advantageous embodiment, the distance from the center of the coating material supply chamber 20 to the center of the opening 65 may be about 0.087 inches.

FIG. 3 is a cross-sectional side view of the rotary dispenser 10. The rotary dispenser 10 is free to rotate about longitudinal axis 35, which may, but need not, coincide with the centerline of coating material supply chamber 20. Fluid dispensing conduit 30 extends at an oblique angle from the coating material supply chamber 20 through the third section 70 of the rotary dispenser 10. Centerline 45 of the fluid dispensing conduit 30 defines the angle θ between the fluid dispensing conduit 30 extends at an oblique angle from the coating material supply chamber 20 through the third section 70 of the rotary dispenser 10. The angle θ may be such that the fluid dispensing conduit 30 extends to outer planar surface 40 or to outer peripheral surface 85 of the rotary dispenser 10. In one advantageous embodiment, as illustrated in FIG. 3, an angle θ of 45 degrees is utilized.

The rotary dispenser is commonly attached to an apparatus, such as a multi-degree of freedom robotic positioning apparatus, that provides accurate positional displacement relative to the article being coated. Therefore, when the rotary dispenser is moved in a horizontal direction relative to a surface, the rotary dispenser can create a round spray which produces a line narrower than about ⅛ inch.

In operation, fluid coating material (not shown) is supplied under pressure to the coating material supply chamber 20, and is then forced through the fluid dispensing conduit 30. At the same time, the rotary dispenser 10 is rotated about longitudinal axis 35, at some desired height above a target surface upon which the coating is to be deposited. The fluid coating material which issues from the outer face 40 will produce a round or circular spray pattern on the target surface. The pattern formed by the resultant deposited coating material will have a clearly defined edge. Also, the amount of spattering, or extraneous coating material deposited outside the circular pattern, is minimized or eliminated.

The entire rotary dispenser 10 can simultaneously be moved in a lateral direction so that the spray pattern forms a continuous, elongated pattern on the target surface. Again, this elongated pattern will have a clearly defined edge, and spattering is minimized.

Figure 4:
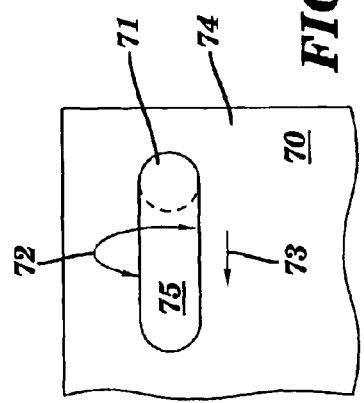
FIG. 4 is a top view of a representative coating pattern as deposited by the rotary dispenser of the present invention.

FIG. 4 is a top view illustrating a representative coating pattern 75 as deposited by the rotary dispenser 10 of the present invention. Rotary dispenser 10 is positioned over upper surface 74 of target substrate 70, and an initial circular pattern 71 (shown partially in phantom) is produced by the application of a coating material via rotary dispenser 10. As the rotary dispenser 10 is moved in direction 73, coating pattern 75 is produced, which has characteristically well-defined edges 72.

Figure 5:
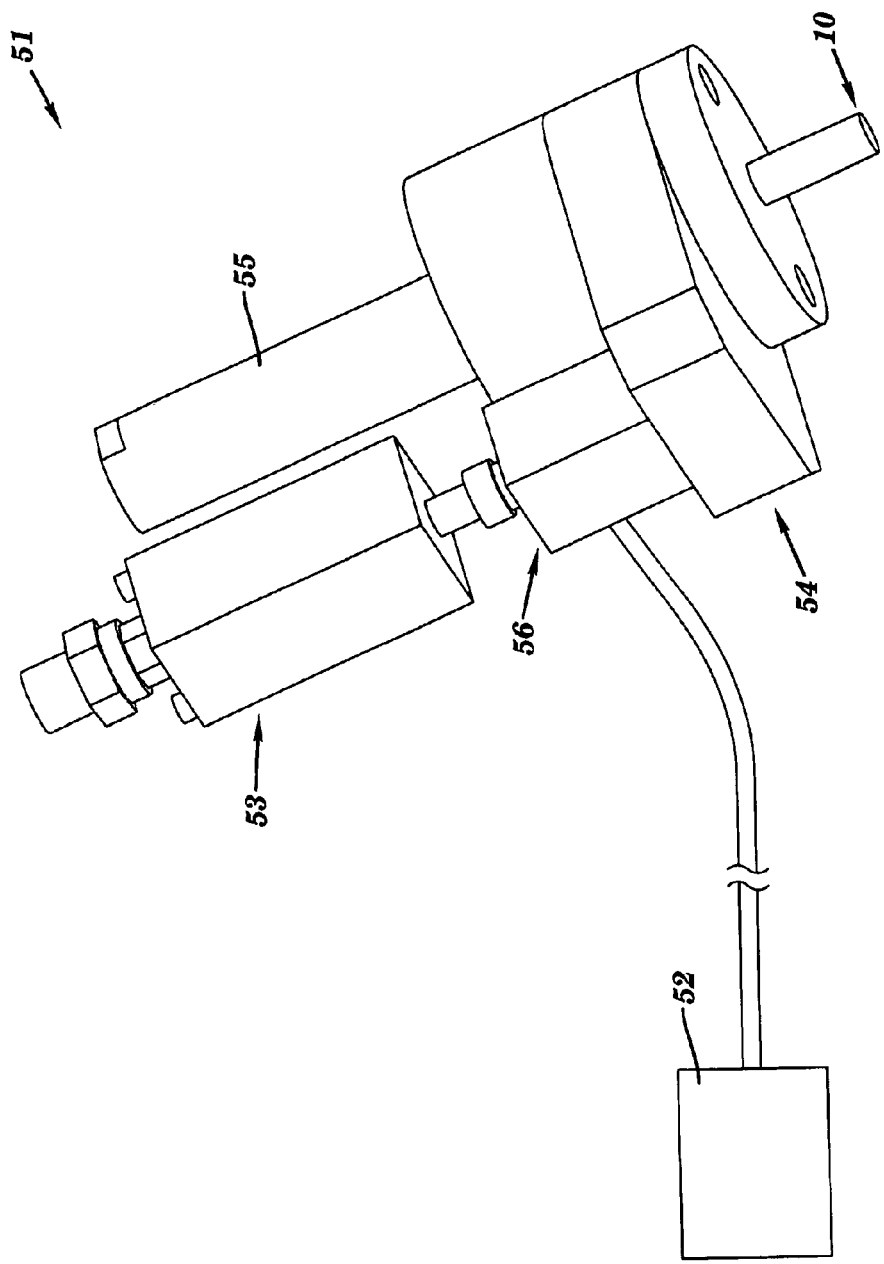
FIG. 5 is a perspective view of a coating application apparatus including a rotary dispenser of the present invention.

FIG. 5 is a perspective view of a coating application system 51 including a rotary dispenser 10 of the present invention. Coating application apparatus 51 includes a supply of fluidic coating material 52, and a fluidic coating material control system 53 which controls the flow of the fluidic coating material 52 in the coating application system 51. A coating material supply system 56 is operationally coupled to the fluidic coating material control system 53 and to a material discharge system 54. The material discharge system 54 includes a rotary dispenser 10 of the present invention. A drive system 55 is operationally coupled to the rotary dispenser 10. The drive system 10 provides motive force and controls the movement of the rotary dispenser 10 in its rotational movement, as well as the lateral movement of the rotary dispenser 10.

As used herein, the term "coating applicator" refers to a portion of a conformal coating system from which the conformal coating is dispensed, such as, for example, a dispensing valve or a spray valve. As used herein, the term "end effector" refers to any device(s) attached to an x, y, z, or other axis of movement to perform various applications, such as, for example, dispensing, pick and place, routing, etc.

Figure 6:
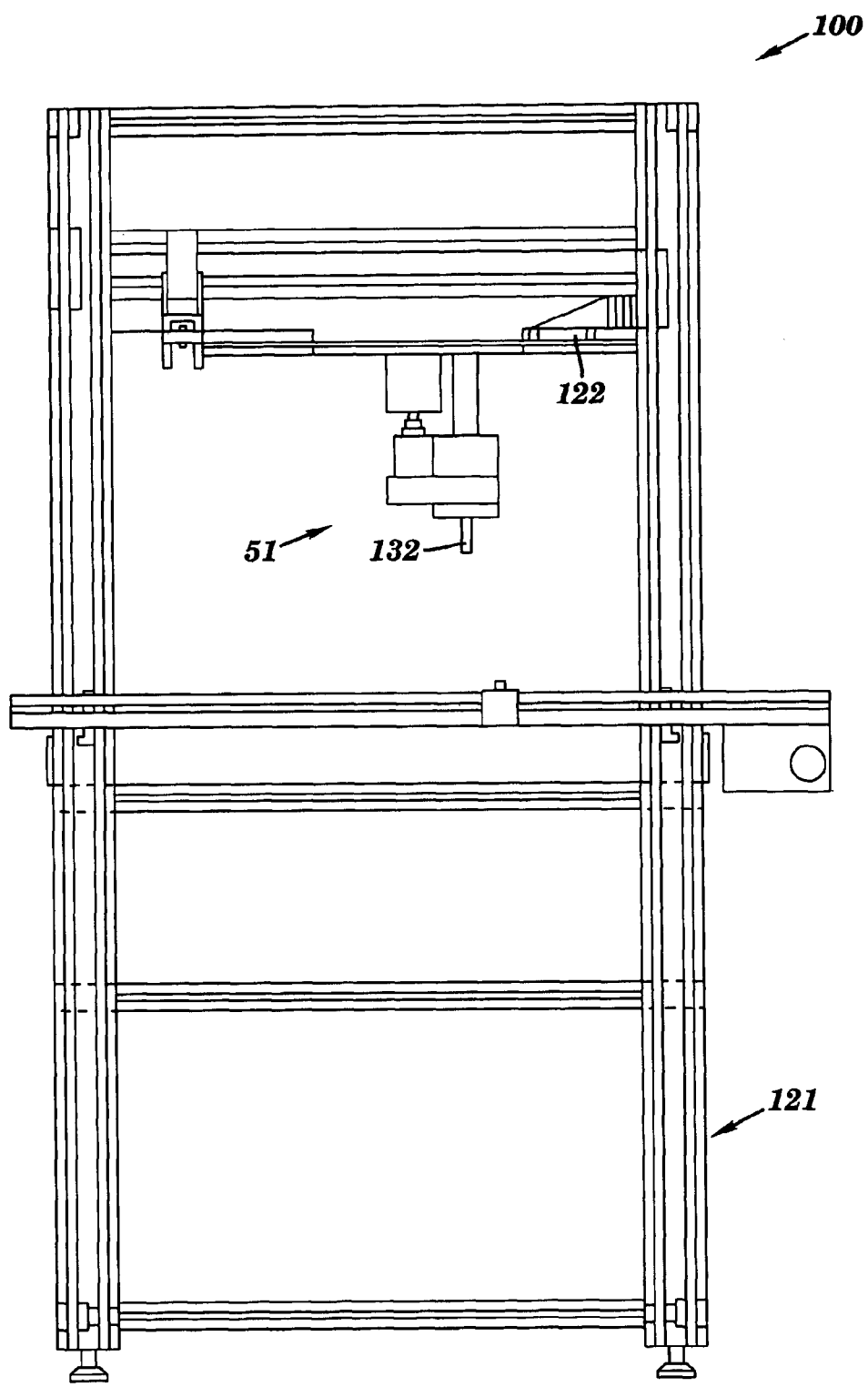
FIG. 6 is a front view of a robotic precision controller having a rotary dispenser of the present invention.
Figure 7:
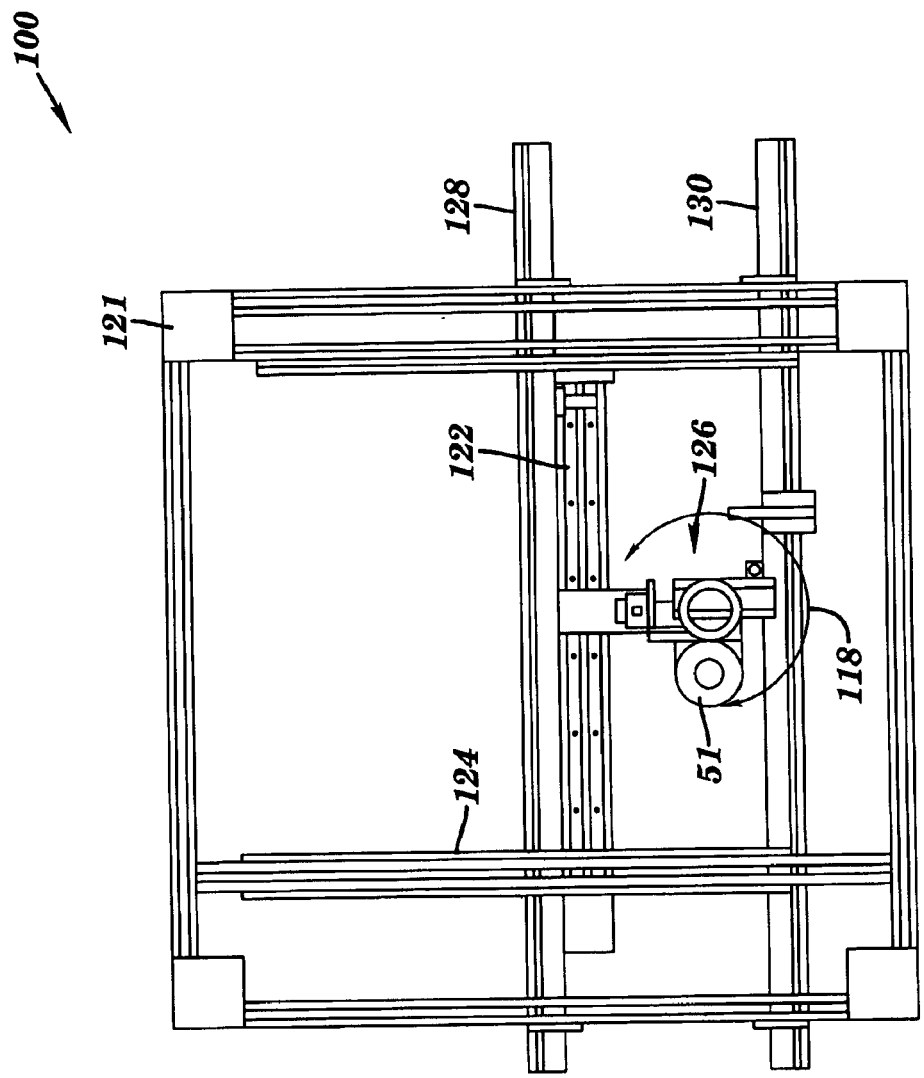
FIG. 7 is a top view of a robotic precision controller having a rotary dispenser of the present invention.

FIG. 6 is a front view of the conformal coating system 100 also shown in FIG. 7. As shown in FIG. 3, attached to end effector 126 is rotary dispenser 10 of coating valve 132. Coating valve 132 uses conformal coating to dispense a pattern, such as, for example, a round spray pattern.

FIG. 7 is a top view of an exemplary precision robotic controller or conformal coating system 100 according to the present invention. System 100, according to the present invention, comprises frame 121, Y axis ball screw slide 122, X axis ball screw slide 124 and end effector 126. End effector 126 is capable of rotation about the φ axis 118. End effector 126 moves left and right along the Y axis by sliding along Y axis ball screw slide 122. Similarly, end effector 126 moves back and forth along with frame members 128 and 130 and Y axis ball screw slide 122, along X axis ball screw slide 124.

The embodiments described above are directed toward the coating of substantially planar articles, such as, inter alia, circuit boards. However, in an alternative application, the rotary dispenser 10 of the present invention could be utilized to coat the interior of hollow articles, such as, inter alia, syringes. In this embodiment, the rotary dispenser 10, or a plurality thereof, could be operationally mounted to an automated machine. The automated machine would provide positioning of the rotary dispenser 10 in the syringe, so that the entire interior surface of the syringe could be coated.

The foregoing description of the present invention has been presented for purposes of illustration and description. It is not intended to be exhaustive or to limit the invention to the precise form disclosed or to the materials in which the form may be embodied, and many modifications and variations are possible in light of the above teaching. For instance, the rotary dispenser of the present invention may be embodied of inter alia, 300 series stainless steel, for use in a printed circuit board coating application. Further, the rotary dispenser of the present invention is not limited to applying ultraviolet (UV) acrylic gels, and moisture and thermal cure silicones to circuit boards, but also can used to spray other materials such as paints, oils, inks, etc. The rotary dispenser can also be used to spray materials onto other surfaces besides circuit boards. The rotary dispenser of the present invention can spray materials with viscosities in the range from about 0 centipoise to about 50,000 centipoise. Such modifications and variations that may be apparent to a person skilled in the art are intended to be included within the scope of this invention as defined by the accompanying claims.

What is claimed is:

1. A coating application system comprising:

a supply fluidic coating material;

a fluidic coating material control system for controlling flow of said fluidic coating material from said supply of fluidic coating material material to a material discharge system;

a coating material supply system in communication with said material discharge system;

said material discharge-system comprising a rotary dispenser;

an in-line drive system, for supplying motive power to move said rotary dispenser in a rotary direction and in a lateral direction, said drive system operationally coupled to said rotary dispenser; and a fluid passage extending through said rotary dispenser, said fluid passage having a first end in communication with said material discharge system and a second end in communication with an outlet opening such said fluidic coating material flowing there through is applied onto a surface, wherein said fluid passage forms an oblique angle between said first end and said second end.

2. The coating application system of claim 1, wherein said material control system includes a material inlet and a valve system for selectively supplying material from said material inlet to the material discharge system.

* * * * *

UNITED STATES PATENT AND TRADEMARK OFFICE
CERTIFICATE OF CORRECTION

PATENT NO. : 6,916,378 B2
DATED : July 12, 2005
INVENTOR(S) : Hynes et al.

It is certified that error appears in the above-identified patent and that said Letters Patent is hereby corrected as shown below:

Column 6,
Line 10, delete "material material" and insert -- material --.

Signed and Sealed this

Sixth Day of September, 2005

JON W. DUDAS
*Director of the United States Patent and Trademark Office*